United States Patent [19]

Feerst

[11] Patent Number: 4,811,425

[45] Date of Patent: Mar. 7, 1989

[54] APPARATUS FOR REDUCING THE EFFECTS OF LOCAL OSCILLATOR LEAKAGE IN MIXERS EMPLOYED IN ZERO IF RECEIVERS

[75] Inventor: Irwin Feerst, Nassau, N.Y.

[73] Assignee: ITT Avionics, a division of ITT Corporation, Nutley, N.J.

[21] Appl. No.: 1,712

[22] Filed: Jan. 9, 1987

[51] Int. Cl.$^4$ .................... H04B 15/06; H04B 1/10
[52] U.S. Cl. .................................. 455/317; 455/209; 455/316; 455/324; 455/310
[58] Field of Search ............... 455/317, 316, 314, 318, 455/319, 256, 304, 305, 207, 208, 209, 310, 324

[56] References Cited

U.S. PATENT DOCUMENTS

| | | |
|---|---|---|
| 3,308,389 | 3/1967 | Toman et al. .................. 455/317 |
| 3,953,805 | 4/1976 | Couvillon ....................... 455/324 |
| 4,254,503 | 3/1981 | Vance . |
| 4,328,850 | 5/1982 | Vemura . |
| 4,462,107 | 7/1984 | Vance ............................. 375/88 |
| 4,470,147 | 9/1984 | Goatcher ........................ 375/77 |
| 4,476,585 | 10/1984 | Reed .............................. 455/207 |
| 4,480,327 | 10/1984 | Vance ............................. 370/27 |
| 4,488,064 | 12/1984 | Vance ............................. 307/297 |
| 4,506,262 | 3/1985 | Vance et al. .................. 340/825.44 |
| 4,509,208 | 4/1985 | Sogo et al. .................... 455/317 |
| 4,521,892 | 6/1985 | Vance et al. ................... 375/88 |
| 4,525,835 | 6/1985 | Vance et al. ................... 370/29 |
| 4,540,958 | 9/1985 | Neyens et al. . |
| 4,584,715 | 4/1986 | Baars et al. ................... 455/317 |
| 4,599,743 | 7/1986 | Reed .............................. 455/316 |

FOREIGN PATENT DOCUMENTS 1530602 11/1978 United Kingdom .
2032737  4/1980 United Kingdom .............. 455/324

OTHER PUBLICATIONS

"An Integrated Circuit V.H.F. Radio Receiver," *The Radio and Electronic Engineer*, vol. 50, No. 4, pp. 158–164, Apr. 1980; I. A. W. Vance.

Primary Examiner—Robert L. Griffin
Assistant Examiner—Ralph E. Smith
Attorney, Agent, or Firm—Robert A. Walsh; Thomas N. Twomey; Mary C. Werner

[57] ABSTRACT

Apparatus for reducing the effects of mixer leakage in a zero IF transmission system includes first and second mixers having relatively equal leakage amounts from an oscillator port to an input port, with the input port of said first mixer adapted to receive a zero IF receiver input signal and with the output port of said first mixer capacitively coupled to the input port of the second mixer. The oscillator ports of the first and second mixers are coupled to a local oscillator output, with the output ports of said first and second mixers coupled respectively to an adder and subtractor circuit to provide respectively a DC signal indicative of the leakage and an output signal indicative of the magnitude of said input signal as effected by leakage to thereby enable the determination of said input signal after mixing.

12 Claims, 1 Drawing Sheet

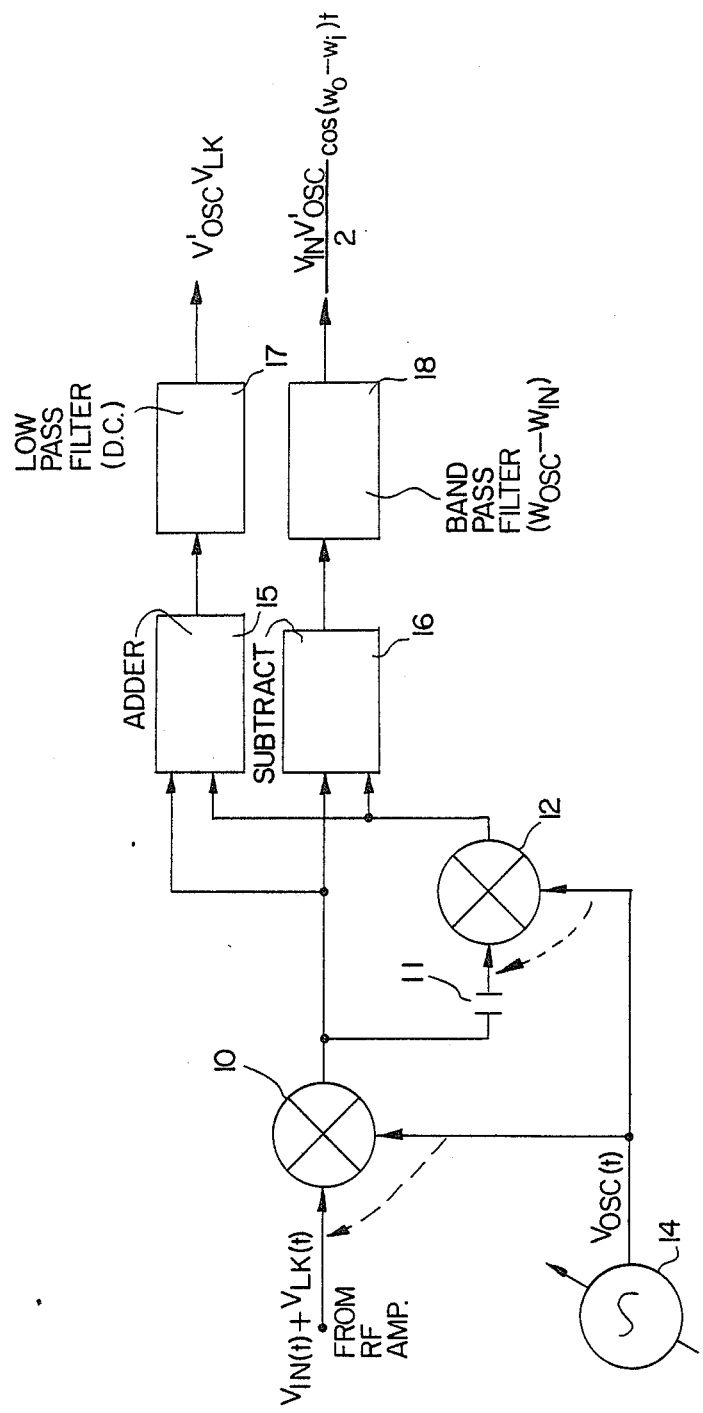

APPARATUS FOR REDUCING THE EFFECTS OF LOCAL OSCILLATOR LEAKAGE IN MIXERS EMPLOYED IN ZERO IF RECEIVERS

This invention was made with Government support under Contract No. F33615-84-C-1410 awarded by the Department of the Air Force. The Government has certain rights in this invention.

BACKGROUND OF THE INVENTION

This invention relates to mixing circuits in general and more particularly to a mixer circuit where the effects of local oscillator leakage is reduced and particularly adapted to be utilized in a zero intermediate frequency (IF) design.

Zero IF type receivers are well known in the prior art and essentially the zero IF type receivers skip the step of going to IF frequency and instead converts the desired incoming signal directly to baseband in a single operation. In addition to the economy of direct conversion there are performance advantages particularly for multiple-function radio receivers. To date, the zero IF type receiver has found only limited use primarily due to the problems resulting from offsets present at the output of mixer circuits which are caused by imperfection in performance.

In particular a very troublesome problem in regard to such mixer circuits is due to mixer leakage. In any event, as indicated above, the zero IF approach has been widely described in the prior art. U.S. Pat. No. 4,328,850 issued on Dec. 9, 1980 to I. A. W. Vance and entitled TRANSMITTER/RECEIVER FOR SINGLE CHANNEL DUPLEX COMMUNICATION SYSTEM describes a transmitter/receiver which can be used for a cordless telephone. The receiver produces direct conversion from the radio frequency. The local oscillator frequency is modulated by an audio signal to be sent, the modulated signal being passed through a dual splitting combining network.

As described in the patent, the receiver makes use of the zero IF or direct conversion method of demodulation. Such a method is also described in British application specification Ser. No. 1,530,602 published Nov. 1, 1978 by I. A. W. Vance.

U.S. Pat. No. 4,470,147 entitled RADIO RECEIVER WITH QUADRATURE DEMODULATION AND DIGITAL PROCESSING issued on Sept. 4, 1984 to J. K. Goatcher and is assigned to the International Standard Electric Corp. This patent depicts a radio receiver which divides the radio frequency input into two channels and in each channel mixes it with the carrier wave frequency. A quadrature shift in a mixed carrier wave frequency enables baseband signals to be filtered from the mixer outputs. Essentially, the analog quadrature signals are converted to digital form and processed digitally to produce the original modulating signal for AM/FM or PM transmissions.

The single sideband modulation and mixing frequency is the sideband center frequency instead of the carrier frequency.

U.S. Pat. No. 4,476,585 entitled baseband demodulator for FM signals issued on Oct. 9, 1984 to J. Reed and is assigned to the International Telephone and Telegraph Corp. shows a modulator which is employed in the zero IF system and uses a local oscillator for providing quadrature output signals at the center frequency of the FM signal to be demodulated. A demodulator has first and second mixers for separately mixing the FM signal with the quadrature signal to provide a first and second output signal, each in quadrature at the outputs of the mixers.

These signals are lowpass filtered. A demodulator is shown which includes third and fourth mixers with each mixer receiving at an input the output of one lowpass filter. At another input the mixers receive the third and fourth signals. The third and fourth signals are derived from mixing a variable controlled oscillator signal with a local oscillator quadrature signal. Essentially, the patent also shows the switching circuit which operates to alternate the third and fourth signals as applied to the input of the third and fourth means as well as the output as applied to the difference amplifier and uses an additional amplifier coupled to the outputs of the mixers so that one can utilize automatic gain control in a zero IF system.

As indicated above, the prior art is fully cognizant of the zero IF technique and it is further evidenced by other U.S. Pat. Nos. which are as follows: 4,540,958, 4,476,585, 4,480,327, 4,462,107, 4,488,064, 4,506,262, 4,521,892, 4,525,835, 4,322,851 and 4,254,503.

The main purpose of such a system is to provide a communication system where the amount of tuned circuitry employed is substantially reduced. In obtaining a reduction in the number of tuned circuits, one is therefore able to integrate large portions of the receiver and produce radio receivers which are extremely compact and reliable. These receivers, as indicated may be employed in many areas such as in selective paging systems and so on. Thus to achieve such advantages, the design of such receivers is implemented according to the zero IF technique. As indicated, in such a system there is present a receiver in which the local oscillator signals are in phase quadrature at the carrier frequency and are each separately mixed with the incoming audio modulated signal. The resultant signals have a zero IF with the two sidebands folded over on each other at the baseband extending in frequency from DC to the single sideband wave of the original signal.

As one can see from the above-cited references, the concentration has mainly been in regard to implementing receiver design or a transmitter design utilizing baseband circuitry. As indicated, baseband circuitry operates at frequencies where integrated circuit technology is well established and therefore a transceiver which consists of primarily of integrated circuits is relatively small and inexpensive.

It is of course a desire of the prior art to obtain improved performance from the receiver. A major difficulty which arises with conventional zero IF receiver architecture revolves around the DC offsets which are present at the output of the mixers. These offsets on the order of millivolts in the presence of generally much smaller desired signals causes the low-noise baseband amplifiers to saturate before the desired signals are amplified efficiently to interface with the analog to digital converter.

In the zero IF receiver, there is a particular problem which results because of the fact that the input frequency is the same as the local oscillator frequency. As one can understand, mixing is a process of multiplication whereby the local oscillator input is multiplied by the input signal or input frequency. When the two frequencies are equal, as in the case of a zero IF receiver, a DC term results. In any event, mixers are not perfect circuits and typically a mixer exhibits a leakage from the local oscillator input port into the signal input port or input section.

Since the local oscillator frequency is the same as the input frequency, this leakage is in fact at the same frequency as the local oscillator frequency. Therefore, a DC term results purely as a result of this leakage. This DC term appears as a genuine input which is applied to the input terminal. Thus as one can ascertain, this results in an undesirable DC voltage at the output of the mixer which essentially appears as an interfering signal. Hence it is an object of the present invention to provide an improved mixer apparatus which substantially reduces the effects of local oscillator leakage.

It is a further object of the present invention to provide a cancellation technique for reducing mixer leakage particularly in a zero IF receiver.

BRIEF DESCRIPTION OF THE PREFERRED EMBODIMENT

Apparatus for reducing the effects of local oscillator leakage in mixing circuits, comprising first and second mixing means each having an input port and method for leaking, a local oscillator port and an output port and each undesirably exhibiting a leakage from said local oscillator port to said input port whereby a given level of local oscillator signal couples to said input port, a local oscillator having an output coupled to said local oscillator ports of said first and second mixing means, means coupled to said input port of said first mixing means for applying a modulated input signal thereto of a given frequency, means for capacitively coupling said input port of said second mixing means to said output port of said first mixing means, adder means having a first input coupled to the output port of said first mixing means and a second input coupled to the output port of said second mixing means to provide at an output a DC signal indicative of the leakage between said input and oscillator ports, subtractor means having a first input coupled to the output port of said first mixing means and a second input coupled to the output port of said second mixing means to provide at an output a signal indicative of said input signal as mixed with said local oscillator frequency and as further effected by said leakage whereby said signal from said subtractor means can be compensated by said signal from said adder means to provide a signal truly indicative of said input signal irrespective of said leakage signal.

BRIEF DESCRIPTION OF THE FIGURE

The sole FIGURE is a detailed block diagram of apparatus for reducing the effects of local oscillator leakage in mixers, particularly those employed in zero IF receiver apparatus.

DETAILED DESCRIPTION OF THE INVENTION

Referring to the sole FIGURE, there is shown apparatus for reducing the effects of local oscillator leakage in mixers.

As one can ascertain from the above, a particular object of the invention is to reduce the effects of local oscillator leakage especially in regard to zero IF receiving systems.

There is shown a first mixer 10 having applied to the input port a signal which is generated by means of a zero IF transmitter system and received by a zero IF receiver. This signal is well known as can be ascertained from the prior art. The mixer 10 has another port coupled to the output of a local oscillator 14. As seen from the FIGURE, the output of mixer 10 is coupled via a capacitor 11 to the input port of a second mixer 12. The second mixer 12 receives an input from the local oscillator 14 which is the same signal as applied to oscillator 10.

As indicated above, both mixers 10 and 12 typically suffer from the fact that a portion of the local oscillator signal which is applied to the local oscillator ports of the mixers is undesirably coupled back to the input ports. In this manner, the actual mixing signal that is provided by the local oscillator is not known due to the fact that a portion of the local oscillator signal is coupled back to the input terminals of the mixers.

Hence, as indicated above, this creates a substantial problem in utilizing mixers due to the leakage in the mixer and considering that the amount of leakage is difficult to process. In this manner, one cannot obtain a true measure of the amplitude of the incoming frequency. As will be described, based on the techniques employed in this invention and as particularly shown in the FIGURE, a major aspect is to utilize mixers 10 and 12 of relatively similar configuration which mixers can for example be fabricated from the same semiconductor material and may be implemented on the same integrated circuit substrate.

As one can ascertain, the entire semiconductor industry utilizes such matching techniques to maintain uniformity of components. Hence, mixers 10 and 12 are conventional mixers which may be purchased and may be the type of mixers that are referred to in the prior art as balanced mixers or balanced modulators.

As seen from the FIGURE the output of mixer 10 is applied to the input of mixer 12 by a capacitor 11. The purpose of the capacitor 11 is to prevent any DC which appears at the output of mixer 10 from being applied to the input of mixer 12. In any event, the output of mixer 10 is also directed to one input of subtractor circuit 16 and to one input of an adder circuit 15. The other inputs to the subtractor 16 and adder 15 are obtained by coupling the output of mixer 12 to each of the above-noted components respectively. Both the adder and subtractor 15 and 16 are conventional operational amplifier devices or similar devices. There are many examples of suitable adding and subtracting circuits that exist in the prior art and that can be utilized according to the teachings of the invention.

As seen from the FIGURE, the output of the adder 15 is coupled to the input of a lowpass filter 17 which as will be explained passes a DC signal which signal is proportional to the effective oscillator signal employed in the mixing process. The output of subtractor 16 is coupled to the input of a bandpass filter 18 whose bandpass is tailored or tuned so that the lower sideband of the mixing process is obtained at the output of the bandpass filter 18. Both the lowpass filter 17 and the bandpass filter 18 are also conventional components and are available in many forms and many configurations.

In order to gain a full understanding of the invention, t is first assumed that there is no leakage from the oscillator port to the input port as indicated in the FIGURE by the dashed arrows associated with each mixer 10 and 12. In this case the input signal and the oscillator signal are given by the following equations whereby the mixer output is also given by the following equations.

$$V_{IN}(t) = V_{IN} \cos \omega_{IN} t \quad \omega = 2\pi f$$

-continued $$V_{osc}(t) = V_{osc} \cos \omega_{osc} t$$

Mixer (10) output = $[V_{IN}(t)][V_{osc}(t)]$

Mixer output = $\dfrac{V_{IN} V_{osc}}{2} [\cos(\omega_{osc} t + \omega_{IN})t +$ $\cos(\omega_{osc} - \omega_{IN})t]$ As one can ascertain, the amplitude of the oscillator voltage $V_{osc}$ is controlled and known. Therefore, it is possible to completely determine the amplitude of the input signal $V_{IN}$. Only one sideband which is conventionally the difference frequency sideband is utilized to determine the output signal and therefore to develop or derive an output signal which is strictly proportional to the input signal as mixed. The whole object of course of the mixing technique is to mix or beat the input signal frequency down to a lower or more manageable frequency. It is of course also desirable at the same time to obtain a measure of the amplitude of the incoming signal.

In any event, with leakage in the mixer this is difficult to achieve since the amount of this leakage is difficult to process and to determine. In regard to the above, it is assumed that mixers 10 and 12 are matched for leakage. That is, the mixers are fabricated by the same circuit techniques or implemented by the same integrated circuit techniques and therefore the same type of mixers are employed for mixers 10 and 12. In this manner, one can be relatively sure that the leakage in regard to both mixers is relatively the same. It is of course also seen from the FIGURE that the amplitude of the oscillator signal as coupled to both mixers is exactly the same and hence if the mixers are closely matched for leakage then the leakage from the oscillator port to the input port will also be the same for each mixer.

In this case then, the actual input signal is a function of the input signal as received plus a function of the oscillator leakage component. This combined signal then is the signal which is acted upon by the mixer 10 and according to the following equations.

$$V_{IN}(t) = V_{IN} \cos \omega_{IN} t$$

$$V_{osc}(t) = V_{osc} \cos \omega_{osc} t$$

$$V_{LK}(t) = V_{LK} \cos \omega_{osc} t$$

$V_{osc}$ = effective oscillator amplitude used for mixing.

$$\begin{aligned}
\text{Mixer (10) output} &= V_{osc}(t)[V_{IN}(t) + V_{LK}(t)] \\
&= [V_{osc} \cos \omega_{osc} t][V_{IN} \cos \omega_{IN} t + V_{LK} \cos \omega_{osc} t] \\
&= V_{IN} V_{osc} \cos \omega_{osc} t \cos \omega_{IN} t + V_{osc} V_{LK} \cos^2 \omega_{osc} t
\end{aligned}$$

$$\text{Mixer (10) output} = \dfrac{V_{IN} V_{osc}}{2} \cos(\omega_{osc} + \omega_{IN})t + \quad (1)$$

$\dfrac{V_{IN} V_{osc}}{2} \cos(\omega_{osc} - \omega_{IN})t + \dfrac{V_{osc} V_{LK}}{2} + \dfrac{V_{osc} V_{LK}}{2} \cos 2\omega_{osc} t$ Frequencies - $D.C.$, $(\omega_{osc} + \omega_{IN})$, $(\omega_{osc} - \omega_{IN})$, $(2\omega_{osc})$ Hence, as one can see from the above-noted equations, the output of the mixer contains a number of frequencies which essentially include a DC component where there is a summed frequency which is proportional to the oscillator frequency plus the input signal frequency, a difference frequency is proportional to the oscillator frequency minus the difference frequency and a component which essentially is twice the oscillator frequency.

Thus as one can ascertain in the output of mixer 10 there is an undesirable component that exits due to leakage, and hence the effective oscillator signal used for mixing is in fact unknown in a conventional circuit. In any event, the output from mixer 10 is passed to mixer 12 through a capacitor which is essentially a DC blocking capacitor.

Thus the input to mixer 12 is the output signal of mixer 10 without the DC term but with the leakage voltage term which is inherent in mixer 10 and mixer 12. Hence according to the above, the equations which govern the output of mixer 2 are given below.

Mixer (12) output =

$[V_{osc} \cos \omega_{osc} t] \left[ V_{LK} \cos \omega_{osc} t + \dfrac{V_{IN} V_{osc}}{2} \cos(\omega_{osc} t \omega_{IN})t + \right.$ $\left. \dfrac{V_{IN} V_{osc}}{2} \cos(\omega_{osc} - \omega_{IN})t + \dfrac{V_{osc} V_{LK}}{2} \cos 2\omega_{osc} t \right]$ Mixer (12) output =

$V_{osc} V_{LK} \cos^2 \omega_{osc} t + \dfrac{V_{IN} V_{osc}^2}{2} \cos \omega_{osc} t \cdot \cos(\omega_{osc} + \omega_{IN})t +$ $\dfrac{V_{IN} V_{osc}^2}{2} \cos \omega_{osc} t \cdot \cos(\omega_{osc} - \omega_{IN})t + \dfrac{V_{LK} V_{osc}^2}{2} \cos \omega_{osc} t \cdot$ $\cos 2\omega_{osc} t$ $$\text{Mixer (12) output} = \dfrac{V_{osc} V_{LK}}{2} + \dfrac{V_{osc} V_{LK}}{2} \cos 2\omega_{osc} t + \quad (2)$$

$\dfrac{V_{IN} V_{osc}^2}{4} \cos(2\omega_{osc} + \omega_{IN})t + \dfrac{V_{IN} V_{osc}^2}{4} \cos \omega_{IN} t +$ $\dfrac{V_{IN} V_{osc}^2}{4} \cos(2\omega_{osc} - \omega_{IN})t + \dfrac{V_{IN} V_{osc}^2}{4} \cos \omega_{IN} t +$ $\dfrac{V_{LK} V_{osc}^2}{4} \cos 3\omega_{os} t + \dfrac{V_{LK} V_{osc}^2}{4} \cos \omega_{osc} t.$ Frequencies present:

$oc$, $\omega_{IN}$, $(2\omega_{osc} - \omega_{IN})$, $(2\omega_{osc} + \omega_{IN})$, $\omega_{osc}$, $2\omega_{osc}$, $3\omega_{os}$ As one can see, the frequencies present at the output of mixer 12 are a DC term, the input frequency, a difference frequency, a summed frequency, the oscillator frequency, twice the oscillator frequency, and three times the oscillator frequency. In any event, the inputs to the subtractor are the output of mixer 10 plus the output of mixer 12, and hence the subtractor output is given by the following equation.

$\dfrac{V_{IN} V_{osc}}{2} \cos(\omega_{osc} + \omega_{IN})t + \dfrac{V_{IN} V_{osc}}{2} \cos(\omega_{osc} - \omega_{IN})t -$ $\dfrac{V_{IN} V_{osc}^2}{4} \cos(2\omega_{osc} + \omega_{IN})t - \dfrac{V_{IN} V_{osc}^2}{2} \cos \omega_{IN} t -$ -continued $$\frac{V_{IN} V_{osc}^2}{4} \cos(2\omega_{osc} - \omega_{IN})t - \frac{V_{LK} V_{osc}^2}{4} \cos 3\omega_{osc} t -$$

$$\frac{V_{LK} V_{osc}^2}{4} \cos \omega_{osc} t$$

As one can ascertain, the subtractor is followed by the bandpass filter 18 which is tuned to a frequency of the oscillator frequency minus the input frequency or:

$$\omega_{osc} - \omega_{IN} \quad (3)$$

Band Pass (18) output $= \frac{V_{IN} V_{osc}}{2} \cos(\omega_{osc} - \omega_{IN})t$ Thus all frequencies outside this particular band are rejected and not amplified. Hence, the output of the bandpass filter is given by the following equation.

$$\frac{V_{IN} V_{osc}}{2} \cos(\omega_{osc} - \omega_{IN})t \quad (3)$$

In any event, the output of mixer 10 and the output of mixer 12 are also applied to the input ports of an adder and the output of the adder is coupled to the input of a lowpass filter 17 whereby only a DC term is permitted to pass. The DC term at the output of the lowpass filter is given by the following equation.

$$\text{Low Pass (17) output} = V_{osc} V_{LK} \quad (4)$$

Since the oscillator out split (which may not be an even split) between V'osc and $V_{LK}$, the $V_{LK}$ term is specified for the two matched mixers then Vosc equals $V_{LK}$ plus $V^1_{osc}$. Thus if $V_{LK}$ is known which it is because it is specified based on the leakage of the mixers and if the oscillator amplitude is known which it is due to the design, then the effective portion of the oscillator signal which is used for mixing is also known. Thus as one can ascertain, since one knows exactly what the effective oscillator voltage is, one can therefore determine what the effect of the oscillator voltage is based on the signal output from bandpass filter 18, and hence the input signal is accurately known.

Thus as one can immediately ascertain from the above, since mixers 10 and 12 exhibit similar leakage, one can completely compensate for this leakage (up to the amount of leakage matching) and determine the exact nature of the effective oscillator voltage which is used in the mixing process. In this manner, this voltage can be compensated for in the actual output obtained from the bandpass filter 18 and hence can be subtracted accordingly. Thus one will have a true indication of the exact magnitude of the input signal regardless of the amount of leakage occurring in both mixer circuits.

It is of course understood that even if the mixers were not perfectly balanced, which is in fact the practical case, then the circuit will still serve to substantially reduce the error due to leakage from the oscillator to the signal input port. One can of course understand that this problem is particularly prevalent in zero IF systems because the leakage from the oscillator port to the input port is at the same frequency as the input signal. Therefore, a DC term results at the output of each mixer which is purely a result of the leakage. This DC term consequently affects or masks the actual input which is applied to the input terminal of the mixer.

Thus as one can see, since the leakage in the mixers is matched the DC terms that result from these leakages are relatively identical. If matching is not perfect then the resulting DC terms are nearly identical. These nearly identical DC terms are then subtracted one from the other to essentially provide a canceled output which contains none of the interfering terms. In any event, in order to determine the exact effective oscillator voltage which is used in the mixing process, one also adds the outputs of the two mixers to obtain a DC term which is indicative of this oscillator voltage.

It should be apparent to those skilled in the art how the outputs of the lowpass filter and bandpass filters can then be employed to strictly determine the effective mixing voltage due to the actual oscillator voltage used and to thereby completely compensate for any leakage from the oscillator port to the input port.

It is therefore indicated that the above techniques and concepts serve to substantially improve the performance of zero IF systems whereby one can now utilize mixers having similar leakage characteristics and obtain output signals which are relatively independent of the leakage from the oscillator port to the input port.

What is claimed is:

1. Apparatus for reducing the effects of local oscillator leakage in mixing circuits, comprising:
    first and second mixing means having an input port, a local oscillator port and an output port and each undesirably exhibiting a leakage from said local oscillator port to said input port whereby a given level of local oscillator signal couples to said input port,
    a local oscillator having an output coupled to said local oscillator ports of said first and second mixing means,
    means coupled to said input port of said first mixing means for applying a modulated input signal thereto of a given frequency,
    means for capacitively coupling said input port of said second mixing means to said output port of said first mixing means,
    adder means having a first input coupled to the output port of said first mixing means and a second input coupled to the output port of said second mixing means to provide at an output a DC signal indicative of the leakage between said input and oscillator ports,
    subtractor means having a first input coupled to the output port of said first mixing means and a second input coupled to the output port of said second mixing means to provide at an output a signal indicative of said input signal as mixed with said local oscillator frequency and as further effected by said leakage whereby said signals from said subtractor means and from said adder means may be combined to produce a signal which is truly indicative of said input signal irrespective of said leakage signal.

2. The apparatus according to claim 1, wherein said first and second mixing means are balanced mixers of identical circuit configuration and fabricated to exhibit relatively identical leakage signal magnitudes.

3. The apparatus according to claim 1, wherein said adder means includes a lowpass filter having an input for receiving the added signal of said first and second mixing means to provide at an output said DC signal of a magnitude equal to the local oscillator signal multiplied by the leakage signal.

4. The apparatus according to claim 1, wherein said subtractor mean includes a bandpass filter having an input for receiving the subtracted signal of said first and second mixing means o provide at an output a signal equal to the difference frequency between said local oscillator and said input signal multiplied by a factor indicative of the product of said input signal level and said local oscillator signal.

5. The apparatus according to claim 1, wherein said input signal is indicative of a zero IF transmission system whereby the frequency of said input signal when not modulated by an information signal is equal to the frequency of said local oscillator signal.

6. Apparatus for reducing the effects of local oscillator leakage in a mixer circuit whereby said leakage undesirably occurs between an oscillator port of said mixer and a signal input port to cause said mixer to undesirably provide an output signal including components due to said leakage signal wherein a zero IF system said signal at said input port and said local oscillator signal are relatively of the same frequency to cause an undesired DC component to appear at said mixer output due to said leakage signal comprising:
 first and second mixers each having an input port, a local oscillator port and an output port, with each mixer exhibiting a given leakage between said local oscillator port and said input port,
 means for applying an input signal to said input port of said first mixer,
 means for applying a local oscillator signal to said local oscillator ports of said first and second mixers,
 means for coupling the output of said first mixer to the signal input of said second mixer,
 means coupled to the outputs of said first and second mixers for respectively adding and subtracting said outputs to provide output signals from each of the adding and subtracting operations which may be combined to produce a signal which is indicative of the input signal and relatively independent of the magnitude of said leakage signal.

7. The apparatus according to claim 6, wherein said means for coupling the output of said first mixer to the signal input of said second mixer includes a capacitor for preventing any DC component of said first mixer output.

8. The apparatus according to claim 6, wherein said means coupled to the outputs of said first and second mixers includes:
 an adder circuit having one input coupled to the output of said first mixer and a second input coupled to the output of said second mixer to provide at an output a summed signal,
 a lowpass filter having an input coupled to the output of said adder for providing at an output a signal indicative of the magnitude of said leakage signal as modified by said oscillator signal.

9. The apparatus according to claim 8, further including a subtractor circuit having one input coupled to the output of said first mixer and another input coupled to the output of said second mixer to provide at an output a difference signal,
 a bandpass filter having an input coupled to the output of said subtractor circuit and operative to provide at an output a signal indicative of said input frequency as mixed with said local oscillator frequency and as further effected by said leakage signal.

10. A method of reducing the effects of local oscillator leakage in mixer circuits comprising the steps of:
 applying an input signal to an input signal port of a first mixer, capacitively coupling an output port of said first mixer to an input port of a second mixer,
 applying a local oscillator signal to an input port of said first and second mixers,
 subtracting the outputs of said mixers to obtain a first output signal having a magnitude indicative of mixer leakage,
 adding the outputs of said mixers to obtain an output signal indicative of the magnitude of mixer leakage as affecting said first output signal.

11. The method according to claim 10, further including the step of:
 lowpass filtering the output signal after adding to obtain a DC signal indicative of mixer leakage.

12. The method according to claim 11, including the step of:
 bandpass filtering the output signal after subtracting to obtain said first signal within a limited frequency range.

* * * * *